United States Patent
Darbha et al.

[19]

[11] Patent Number: 5,904,555
[45] Date of Patent: May 18, 1999

[54] METHOD FOR PACKAGING A SEMICONDUCTOR DEVICE

[75] Inventors: Sury Narayana Darbha, Tempe; John R. Lynch, Scottsdale, both of Ariz.

[73] Assignee: Motorola, Inc., Schaumburg, Ill.

[21] Appl. No.: 09/016,985

[22] Filed: Feb. 2, 1998

[51] Int. Cl.[6] .................................................. H01L 21/44
[52] U.S. Cl. ........................ 438/613; 438/106; 438/612; 438/113
[58] Field of Search .................................... 438/613, 612, 438/113, 106

[56] References Cited

U.S. PATENT DOCUMENTS

| | | | |
|---|---|---|---|
| 3,723,835 | 3/1973 | Davis et al. | 317/234 R |
| 3,964,920 | 6/1976 | Davis et al. | 106/53 |
| 4,131,478 | 12/1978 | Davis et al. | 106/53 |
| 4,146,655 | 3/1979 | Davis et al. | 427/93 |
| 4,172,907 | 10/1979 | Mones et al. | 438/613 |
| 5,172,214 | 12/1992 | Casto | 438/127 |
| 5,249,450 | 10/1993 | Wood et al. | 438/613 |
| 5,616,517 | 4/1997 | Wen et al. | 438/613 |

*Primary Examiner*—Kevin M. Picardat
*Assistant Examiner*—Deven Collins
*Attorney, Agent, or Firm*—Daniel R. Collopy

[57] ABSTRACT

A method for packaging a semiconductor device (22) formed on a die (12) having opposing major surfaces includes pre-soldering the die (12) at wafer level using an electroplating process, wherein the die (12) has solder bumps disposed on each opposing major surface. The pre-soldered wafer (10) is then diced into pre-soldered dies. The die (12) is placed in a glass sleeve (45) and aligned with two bumpless lead assemblies (46, 48). The bumpless lead assemblies (46, 48) are solder bonded to the die (12) via a reflow process. The reflow process also partially melts the glass sleeve (45), thereby forming a hermetically sealed glass capsule (55) surrounding the semiconductor device (22).

20 Claims, 3 Drawing Sheets

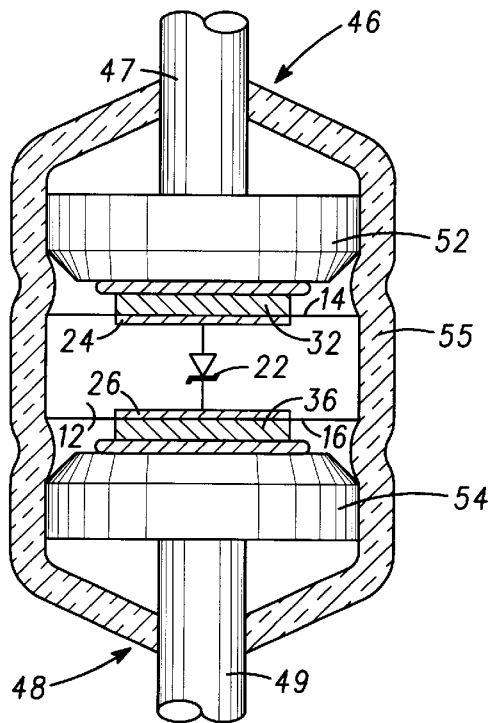
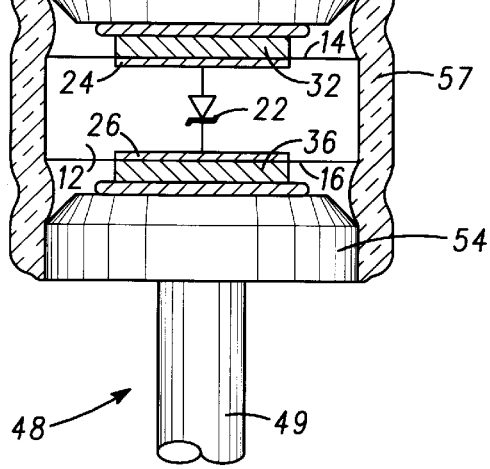
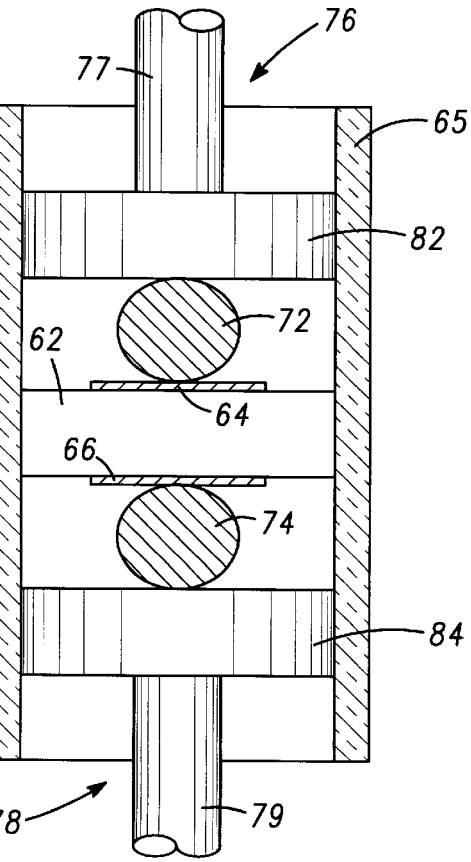
FIG. 7
FIG. 8
FIG. 9

METHOD FOR PACKAGING A SEMICONDUCTOR DEVICE

BACKGROUND OF THE INVENTION

The present invention relates, in general, to semiconductor devices and, more particularly to the packaging of semiconductor devices.

Generally, discrete semiconductor devices such as diodes, resistors, capacitors, etc. are packaged into epoxy-molded or ceramic packages. An initial step in a packaging process for a discrete device, e.g., a diode, is forming a solder ball-lead assembly by attaching two solder balls to two leads via a first reflow step. The two leads are placed adjacent the diode die so that the two solder balls are in contact with two bonding pads on the diode die. In a second reflow step, the two solder balls form solder bumps bonding the two leads to the diode die. The diode die is then enclosed in an epoxy molding material to form an epoxy-molded package with the two leads protruding therefrom.

The conventional packaging process requires at least two reflow steps which are time consuming and cost inefficient. Attaching solder balls to the leads and placing the leads adjacent to the die are labor intensive. The epoxy-molding process is also expensive. Further, in a molding process, approximately 50% of the epoxy resin is wasted as scrap. In addition, the inconsistency in size and shape of the solder bumps and misalignment of the leads to the die often degrade the yield, reliability, and performance of the device.

Accordingly, it would be advantageous to have a simple and reliable method for packaging a semiconductor device. It is desirable for the method to be time, material, and cost efficient. It is also desirable for the method to be compatible with existing device fabrication processes.

BRIEF DESCRIPTION OF THE DRAWINGS

FIGS. 6 and 7 illustrate, in cross-sectional views, a semiconductor device package in accordance with an embodiment of the present invention; and FIGS. 8 and 9 illustrate, in cross-sectional views, semiconductor device packages in accordance with alternative embodiments of the present invention.

Figure 1:
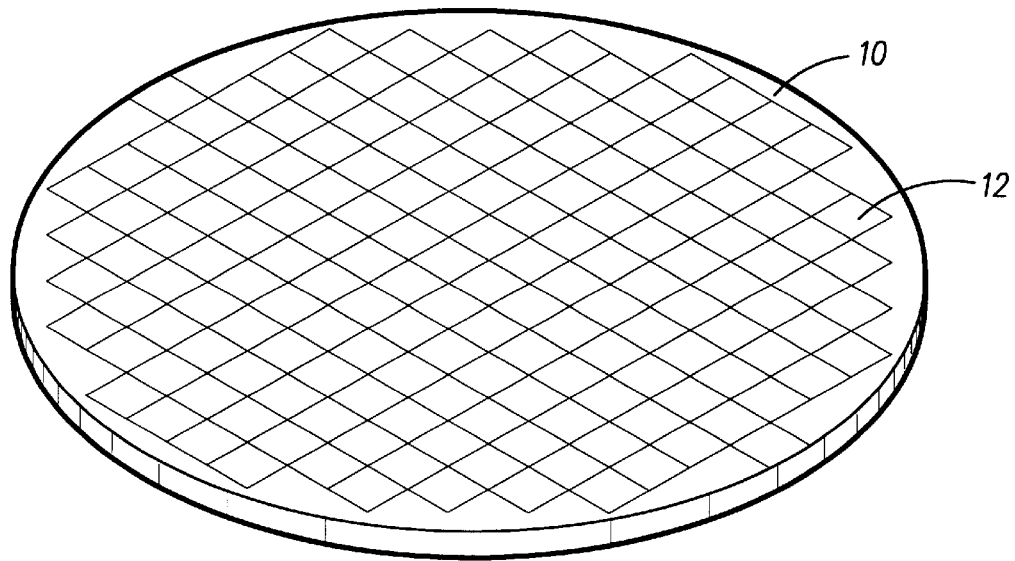
FIG. 1 illustrates a semiconductor wafer having semiconductor devices formed thereon.

It should be understood that for simplicity and clarity of illustration, elements illustrated in the figures are not necessarily drawn to scale. It should also be understood that, where considered appropriate, reference numerals have been repeated among the figures to indicate corresponding or analogous elements.

DETAILED DESCRIPTION OF THE DRAWINGS

Generally, the present invention provides a packaging process or method for packaging a semiconductor device. In accordance with the present invention, the packaging process requires only one reflow step to bond a lead assembly to the semiconductor device and, if preferred, to hermetically seal the device. In a preferred embodiment, solder bumps are formed on the die at wafer level via an electroplating process which generally produces solder bumps having a substantially uniform size and shape, thereby improving the reliability and performance of the device compared with prior art packaging processes. The electroplating process can also be easily automated.

FIG. 1 schematically illustrates a semiconductor wafer 10 having a plurality of dies formed thereon. A die 12 is shown in FIG. 1 as a representative die on wafer 10. A method for packaging a semiconductor device formed on die 12 in accordance with the present invention is described hereinafter.

Figure 2:
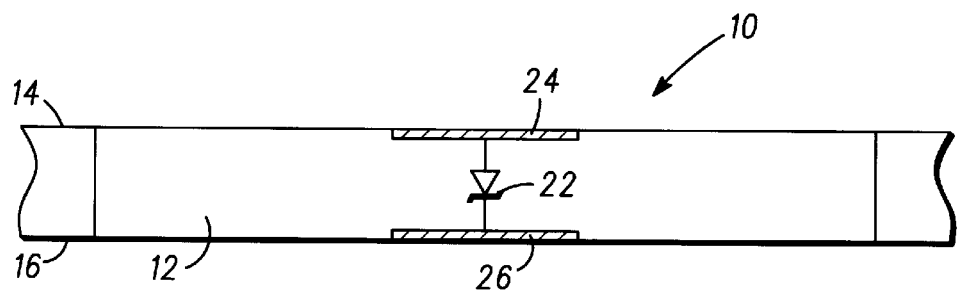
FIGS. 2–5 illustrate, in cross-sectional views, a process of forming solder bumps on the semiconductor wafer of FIG. 1 in a packaging process in accordance with the present invention.

FIG. 2 is a schematic cross-sectional view of a portion of wafer 10 that includes semiconductor die 12. Wafer 10 has major surfaces 14 and 16, which are also referred to as a front surface and a back surface, respectively, of wafer 10. Die 12 includes a semiconductor device 22 such as, for example, a Zener diode, that has one electrode 24, e.g., an anode, on front surface 14 and another electrode 26, e.g., a cathode, on back surface 16. Electrodes 24 and 26 of device 22 can be formed from any kind of conductive material such as, for example, silicide, metallic alloy, or the like. Passivation layers (not shown) are typically formed on portions of major surfaces 14 and 16 outside the regions where the electrodes, e.g., electrodes 24 and 26, are formed.

It should be understood that device 22 is not limited to being a Zener diode. In accordance with the present invention, die 12 can include any electronic device such as, for example, a resistor, a capacitor, an inductor, a diode, a Schottky diode, a thyristor, a thermistor, a transistor, etc. Further, die 12 is not limited to including a single discrete device 22 as shown in FIG. 2. Die 12 can include any electronic component that has at least one electrode on a major surface of wafer 10. For example, die 12 can include an integrated circuit element comprised of a plurality of devices.

Figure 3:
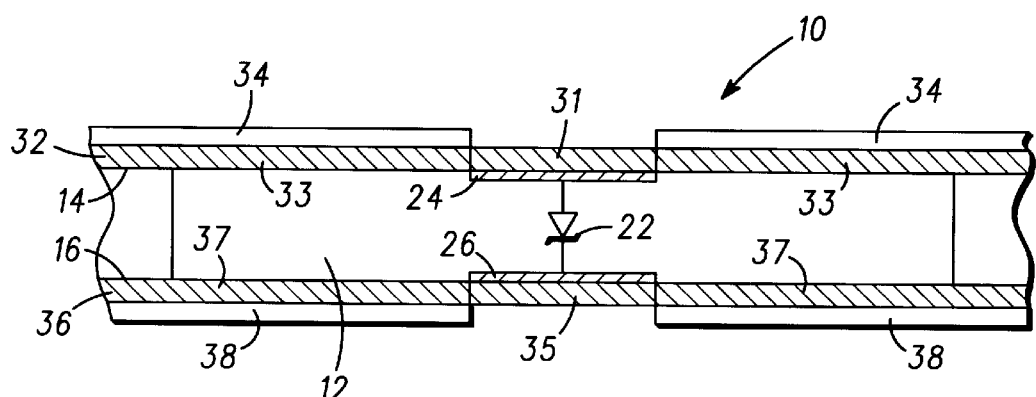

Referring now to FIG. 3, conductive layers 32 and 36 are disposed on major surfaces 14 and 16, respectively, of semiconductor wafer 10. Suitable techniques for applying conductive layers 32 and 36 to major surfaces 14 and 16, respectively, include chemical vapor deposition, sputtering, etc. Conductive layer 32 is electrically connected to electrode 24 and conductive layer 36 is electrically connected to electrode 26. Because solder bumps are to be formed on conductive layers 32 and 36, conductive layers 32 and 36 are also referred to as solder bump seed layers or simply seed layers. In a preferred embodiment, each of seed layers 32 and 36 is a composite layer including three metal layers: a layer of titanium on the major surface of wafer 10, a layer of nickel on the titanium layer, and a layer of silver on the nickel layer. In an alternative embodiment, each of seed layers 32 and 36 includes layers of titanium, tungsten, and copper. Other kinds of metallic layers can also be formed on major surfaces 14 and 16 and serve as seed layers 32 and 36.

A photoresist layer 34 is disposed on seed layer 32 and patterned to expose a portion 31 of seed layer 32. Photoresist layer 34 functions as a masking layer to mask a portion 33 of seed layer 32. Preferably, portion 31 of seed layer 32 overlies at least a portion of electrode 24. Likewise, a photoresist layer 38 is disposed on seed layer 36 and patterned to be absent from a portion 35 of seed layer 36. Photoresist layer 38 functions as a mask that overlies a portion 37 of seed layer 36. Preferably, portion 35 of seed layer 36 overlies at least a portion of electrode 26. Portions 31 and 35 of seed layers 32 and 36, respectively, are also referred to as bonding pads on die 12. Preferably, a dual sided alignment photo exposure tool is used in the patterning of photoresist layers 34 and 38. Optionally, the patterning of photoresist layer 38 also forms a pattern of saw streets (not shown) on back surface 16. The saw streets on back surface 16 facilitate the dicing of wafer 10 in a subsequent step.

Figure 4:
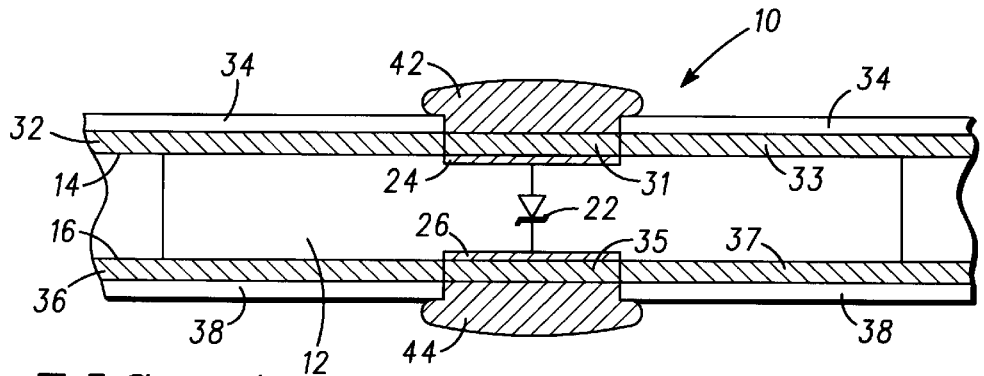

Next, wafer 10 is submerged in a bath of solder (not shown). By way of example, the solder bath is a solution of a solder comprised of approximately 95% lead and 5% tin by weight dissolved in methyl sulfonic acid. Other types of solders and solvents can also be used to practice the present invention. Wafer 10 and the solder bath are coupled to an electrical voltage source (not shown). A current flows in the solder bath, causing the solder to be electroplated or electrodeposited on portions of seed layers 32 and 36 that are unprotected by photoresist layers 34 and 38, respectively. Now referring to FIG. 4, a solder bump 42 is formed on portion 31 of seed layer 32 and a solder bump 44 is formed on portion 35 of seed layer 36.

It should be understood that the solder bumps on major surfaces 14 and 16 of wafer 10 are not limited to being formed using an electroplating process. For example, the solder bumps on wafer 10 can also be formed via a chemical vapor deposition process, a squeegee bump process, a stencil printing process, a jet printing process, or the like.

Figure 5:
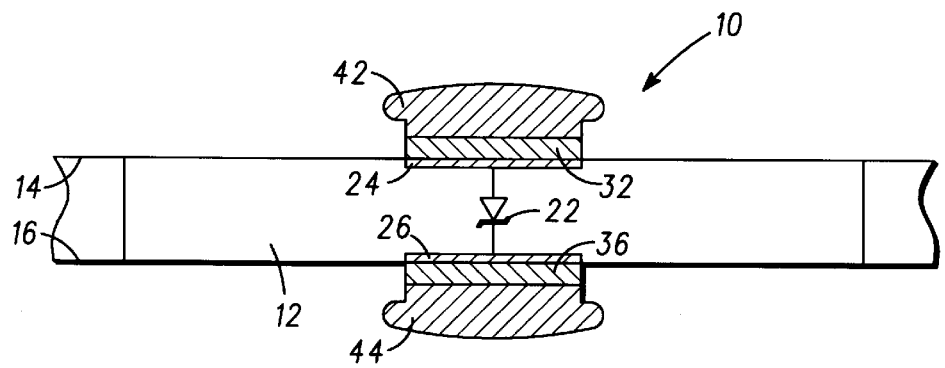

Photoresist layers 34 and 38 are then removed. Subsequently, exposed portions of seed layers 32 and 36, e.g., portions 33 and 37, are removed from major surfaces 14 and 16 of wafer 10 using an etching process. By way of example, a solution of acetic acid and nitric acid is used for etching the silver and nickel layers, and a solution of hydrofluoric acid is used for etching the titanium layer. The copper layer can be etched using copper sulfate or sulfuric acid, and the tungsten layer can be etched using a mixture of ammonium hydroxide and hydrogen peroxide as the etchant. Referring now to FIG. 5, after removing or lifting off photoresist layers 34 and 38, and the underlying portions of seed layers 32 and 36, wafer 10 has a plurality of solder bumps formed on major surfaces 14 and 16. Such a wafer is referred to as a pre-soldered wafer. FIG. 5 shows two representative solder bumps, i.e., solder bump 42 on front surface 14 and solder bump 44 on back surface 16. Each solder bump is electrically coupled to a corresponding electrode of a semiconductor device formed in a die on pre-soldered semiconductor wafer 10. For example, solder bump 42 is electrically connected to electrode 24 of device 22 formed in die 12 on pre-soldered wafer 10.

As described hereinbefore, forming pre-soldered wafer 10 includes, disposing conductive layers 32 and 36 on major surfaces 14 and 16, respectively; forming and patterning masking layers 34 and 38 on conductive layers 32 and 36, respectively; and forming solder bumps by electroplating solder on conductive layers 32 and 36. The solder bumps, e.g., solder bumps 42 and 44, on pre-soldered wafer 10 are generally uniform in size and shape.

Pre-soldered wafer 10 is diced. Die 12 is separated from other dies on pre-soldered wafer 10. Die 12 has solder bumps 42 and 44 formed thereon. Therefore, die 12 is also referred to as a pre-soldered die.

Figure 6:
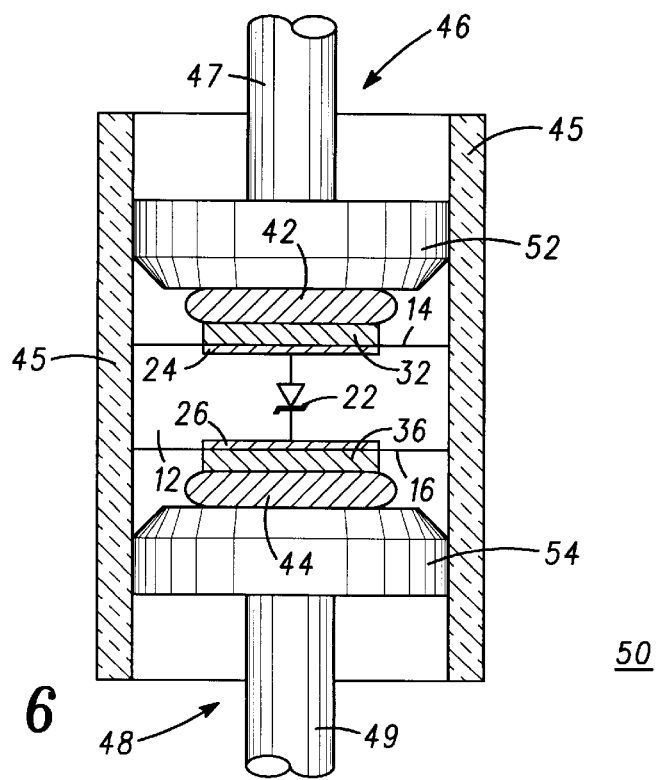

FIG. 6 is a schematic cross-sectional view of an electronic component 50 which comprises pre-soldered die 12 placed in a glass tube 45 and aligned with interconnect structures 46 and 48. Interconnect structure 46 has a lead 47 attached to a header or a slug 52 and interconnect structure 48 has a lead 49 attached to a header or a slug 54. Thus, interconnect structure 46 and 48 are also referred to as lead assemblies. In accordance with the present invention, interconnect structures 46 and 48 do not have solder bumps formed thereon and are, therefore, also referred to as bumpless lead assemblies. Interconnect structures 46 and 48 can be unitary structures made of a single material such as, for example, copper. Interconnect structures 46 and 48 can also be a non-unitary structure comprised of a single material or two dissimilar materials. For example, lead 47 can be a copper wire that is welded to slug 52 which may be, for example, a nickel-iron pedestal. Alternatively, lead 47 can be a nickel-iron alloy material. It should be noted that the materials of leads 47 and 49 and slugs 52 and 54 are not limitations of the present invention.

Glass tube 45 is also referred to as a glass sleeve. Preferably, glass sleeve 45 is preformed to be cost efficient and time efficient. By way of example, glass sleeve 45 is formed using a glass in the lead-borate-silicate family of materials. Such a glass material offers unique properties, e.g., low thermal expansion and low melting temperature that are suitable for the packaging process of semiconductor devices such as diodes, transistors, etc. In one embodiment, glass sleeve 45 is formed in a drawing process that draws glass fibers from a viscous glass melt and extrudes the glass fibers into a cylindrical tube. In an alternative embodiment, glass sleeve 45 is formed by spray drying a mixture of raw glass powders, ceramic additives, and binders to form spray dried granules, pressing the spray dried granules into a cylindrical preform, and sintering the cylindrical preform. Glass sleeves formed in accordance with both of the above mentioned embodiments are commercially available.

In glass sleeve 45, bumpless lead assemblies 46 and 48 are adjacent to major surfaces 14 and 16, respectively, of die 12. In the embodiment shown in FIG. 6, the diameters of slugs 52 and 54 are substantially equal to the inner diameter of glass sleeve 45. In an alternative embodiment, glass sleeve 45 has a groove (not shown) on its inner wall, and each of slugs 52 and 54 has a protrusion (not shown) formed thereon. The protrusions on slugs 52 and 54 mate with the groove on glass sleeve 45 to assist the alignment of lead assemblies 46 and 48 with die 12 and the positioning of die 12 and lead assemblies 46 and 48 in glass sleeve 45. In another alternative embodiment, glass sleeve 45 has a protrusion (not shown) on its inner wall, and each of slugs 52 and 54 has a groove (not shown) formed thereon. The grooves on slugs 52 and 54 mate with the protrusion on glass sleeve 45 to assist the alignment of lead assemblies 46 and 48 with die 12 and the positioning of die 12 and lead assemblies 46 and 48 in glass sleeve 45. It should be understood that other types of glass sleeves and lead assemblies can also be used to practice the present invention.

A reflow process is performed by placing electronic component 50 in an elevated temperature environment, e.g., an oven. By way of example, the reflow process is performed at a temperature between approximately 360 degrees Celsius (°C.) and approximately 500° C. and lasts between approximately 4 minutes and approximately 12 minutes. The time duration of the reflow process depends on the temperature. Usually, the higher the temperature is, the shorter the reflow process lasts. In a preferred embodiment, the reflow process is performed at approximately 380° C. and lasts for approximately 10 minutes. During the reflow process, solder bumps 42 and 44 melt and bond lead assemblies 46 and 48 to electrodes 24 and 26, respectively.

The reflow process also heats glass sleeve 45. Preferably, the temperature of the reflow process is near the melting temperature of the material of glass sleeve 45. Glass sleeve 45 partially melts and encases die 12 and slugs 52 and 54. When the glass re-solidifies, it forms a glass capsule that hermetically seals die 12 and slugs 52 and 54 within the capsule, as shown in FIG. 7. The capsule is formed from glass sleeve 45 and is represented by a reference number 55, Electronic component 50 becomes a hermetically sealed discrete device. Leads 47 and 49 of lead assemblies 46 and 48, respectively, protrude from glass capsule 55. FIG. 8 illustrates an electronic component 58 in accordance with an alternative embodiment of the present invention. In the embodiment, die 12 and bumpless lead assemblies 46 and 48 are placed in a glass sleeve 57 that is shorter than glass sleeve 45 shown in FIG. 6. After the reflow process, glass sleeve 57 cooperates with slugs 52 and 54 to form a package 58 that encapsulates and hermetically seals die 12.

It should be understood that the temperature and time duration of the reflow process are not limited to being those described hereinbefore. The temperature and time duration of the reflow process are generally determined in accordance with the type of device formed on die 12, the composition of solder bumps 42 and 44, and the melting temperature of glass sleeve 45. Preferably, the reflow temperature is sufficiently high to melt solder bumps 42 and 44 and partially melt glass sleeve 45, but sufficiently low so that the characteristics of device 22 are not adversely affected. The time duration of the reflow process is preferably adjusted to optimize the solder bonding process and the hermetic sealing process. The reflow process can also be adjusted so that the glass sleeve does not hermetically seal die 12. Preferably, the reflow process is followed by a rapid cooling process to prevent the run off of solder and/or glass.

It should be understood that a pre-soldered die, e.g., die 12, formed in a pre-soldering process described with reference to FIGS. 2–5 is not limited to being packaged in a glass sleeve, e.g., glass sleeve 45 or glass sleeve 57, in processes described with reference to FIGS. 6–8. For example, a pre-soldered die can also be packaged in an epoxy molding process. In addition, a glass sleeve is not limited to being used in packaging a pre-soldered die prepared in a process described with reference to FIGS. 2–5.

FIG. 9 is a cross-sectional view of an electronic component 60 packaged in accordance with another embodiment of the present invention. Electronic component 60 comprises a semiconductor die 62 placed in a glass tube 65 and aligned with bumpless lead assemblies 76 and 78. Like glass tube 45 shown in FIG. 6, glass tube 65 may have a groove or a protrusion to assist in the alignment of lead assemblies 76 and 78 with die 62. Die 62 has bonding pads 64 and 66 on its two major surfaces and electrically coupled to two electrodes of a semiconductor device (not shown) formed on die 62. Lead assembly 76 has a lead 77 attached to a slug 82 and lead assembly 78 has a lead 79 attached to a slug 84. Unlike die 12 shown in FIGS. 6 and 7, die 62 is not pre-soldered and, therefore, does not have solder bumps formed thereon. A solder ball 72 is placed in glass tube 65 between bonding pad 64 on die 62 and slug 82. Likewise, a solder ball 74 is placed in glass tube 65 between bonding pad 66 on die 62 and slug 84.

Electronic component 60 is placed in an elevated temperature environment in a reflow process. Solder balls 72 and 74 are reflowed to bond slugs 82 and 84 to bonding pads 64 and 66, respectively, of die 62. The reflow process also heats glass tube 65. Glass tube 65 partially melts and encases die 62 and slugs 82 and 84. When the glass re-solidifies, it forms a glass capsule (not shown). Preferably, the glass capsule hermetically seals die 62 and slugs 82 and 84. Leads 77 and 79 of lead assemblies 76 and 78, respectively, protrude from the glass capsule. Electronic component 60 becomes a hermetically sealed discrete device.

By now it should be appreciated that a packaging process or a method for packaging a semiconductor device has been provided. The packaging process of the present invention requires only one reflow step. In accordance with a preferred embodiment of the present invention, the semiconductor device is pre-soldered at wafer level and hermetically sealed in a preformed glass tube. So, the packaging process is time efficient, labor efficient, material efficient, and cost efficient compared with prior art packaging processes. The electroplating pre-soldering process of the present invention generates solder bumps that are uniform in size and shape, which results in improved yield, reliability, and performance of the semiconductor device. Further, the electroplating process is compatible with solder of different compositions. Thus, the packaging process of the present invention is especially suitable for use with environmentally friendly solder compositions such as, for example, low lead solder, lead free solder, or the like. In addition, the electroplating and alignment processes of the present invention can be easily automated, further reducing the cost of the device.

We claim:

1. A method for packaging a semiconductor device, comprising the steps of:

providing the semiconductor device on a die and having a first electrode on a first surface of the die;

aligning a first bumpless lead assembly with the first electrode of the semiconductor device; and solder bonding the first bumpless lead assembly to the first electrode of the semiconductor device.

2. The method as claimed in claim 1, wherein:

the step of providing the semiconductor device further includes providing the semiconductor device having a second electrode on a second surface of the die;

the step of aligning a first bumpless lead assembly with the first electrode of the semiconductor device further includes aligning a second bumpless lead assembly with the second electrode of the semiconductor device; and the step of solder bonding the first bumpless lead assembly to the first electrode of the semiconductor device further includes solder bonding the second bumpless lead assembly to the second electrode of the semiconductor device.

3. The method as claimed in claim 1, wherein the step of providing the semiconductor device further includes the step of forming a solder bump over the first electrode of the semiconductor device.

4. The method as claimed in claim 3, wherein the step of forming a solder bump includes the steps of:

forming a seed layer over the first surface of the die;

disposing a mask over the seed layer, the mask exposing a first portion of the seed layer and overlying a second portion of the seed layer; and forming the solder bump on the first portion of the seed layer.

5. The method as claimed in claim 4, wherein the step of disposing a mask includes the step of disposing and patterning a photoresist layer on the seed layer.

6. The method as claimed in claim 4, wherein the step of forming the solder bump further includes the step of electrodepositing solder on the first portion of the seed layer.

7. The method as claimed in claim 4, further comprising the step of removing the mask and the second portion of the seed layer from the first surface of the die.

8. The method as claimed in claim 1, wherein the step of aligning a first bumpless lead assembly with the first electrode of the semiconductor device includes the step of placing the first bumpless lead assembly and the die in a glass tube.

9. The method as claimed in claim 8, wherein the step of solder bonding the first bumpless lead assembly to the first electrode of the semiconductor device further includes heating the glass tube to hermetically seal the die within the glass tube.

10. A method for packaging a semiconductor device, comprising the steps of:
   providing a die having the semiconductor device formed thereon, the semiconductor device having a first electrode and a second electrode on a first surface and a second surface, respectively, of the die;
   placing a first bumpless lead assembly, the die, and a second bumpless lead assembly in a glass sleeve so that the first bumpless lead assembly and the second bumpless lead assembly are adjacent the first electrode and the second electrode, respectively, of the semiconductor device; and
   heating the glass sleeve to solder bond the first bumpless lead assembly and the second bumpless lead assembly to the first electrode and the second electrode, respectively, of the semiconductor device.

11. The method as claimed in claim 10, wherein the step of providing the die further includes the steps of:
   disposing a first conductive layer and a second conductive layer over the first surface and the second surface, respectively, of the die;
   forming and patterning a first photoresist layer and a second photoresist layer over the first conductive layer and the second conductive layer, respectively, the first photoresist layer and the second photoresist layer exposing a first portion of the first conductive layer overlying at least a portion of the first electrode and a first portion of the second conductive layer overlying at least a portion of the second electrode, respectively; and
   forming a first solder bump and a second solder bump on the first portion of the first conductive layer and the first portion of the second conductive layer, respectively.

12. The method as claimed in claim 11, wherein the step of forming a first solder bump and a second solder bump includes the step of electroplating solder on the first portion of the first conductive layer and the first portion of the second conductive layer.

13. The method as claimed in claim 12, wherein:
   the step of providing a die includes providing a semiconductor wafer on which the die is formed; and
   the step of forming a first solder bump and a second solder bump includes the steps of submerging the semiconductor wafer in solder and dicing the semiconductor wafer.

14. The method as claimed in claim 12, further comprising the steps of:
   removing the first photoresist layer and the second photoresist layer; and
   removing a second portion of the first conductive layer and a second portion of the second conductive layer that are unprotected by the first solder bump and the second solder bump, respectively.

15. The method as claimed in claim 10, wherein the step of placing a first bumpless lead assembly, the die, and a second bumpless lead assembly in a glass sleeve further includes placing a first solder ball between the first bumpless lead assembly and the first surface of the die and a second solder ball between the second bumpless lead assembly and the second surface of the die.

16. A packaging process, comprising the steps of:
   providing a semiconductor wafer having a plurality of dies formed thereon, a die of the plurality of dies comprised of at least one semiconductor device that has a first electrode and a second electrode on a first major surface and a second major surface, respectively, of the semiconductor wafer;
   forming a first plurality of solder bumps and a second plurality of solder bumps on the first major surface and the second major surface, respectively, of the semiconductor wafer, a solder bump of the first plurality of solder bumps and a solder bump of the second plurality of solder bumps being electrically coupled to the first electrode and the second electrode, respectively, of the at least one semiconductor device;
   dicing the semiconductor wafer and selecting the die comprised of the at least one semiconductor device;
   aligning a first bumpless lead assembly, the die comprised of the at least one semiconductor device, and a second bumpless lead assembly in a glass sleeve so that the first bumpless lead assembly and the second bumpless lead assembly are adjacent the first electrode and the second electrode, respectively, of the at least one semiconductor device; and
   heating the glass sleeve to solder bond the first bumpless lead assembly and the second bumpless lead assembly to the first electrode and the second electrode, respectively, of the at least one semiconductor device.

17. The packaging process of claim 16, wherein the step of forming a first plurality of solder bumps and a second plurality of solder bumps includes the steps of:
   disposing a first conductive layer and a second conductive layer over the first major surface and the second major surface, respectively, of the semiconductor wafer;
   forming and patterning a first masking layer and a second masking layer over the first conductive layer and the second conductive layer, respectively; and
   forming the first plurality of solder bumps and the second plurality of solder bumps on the first conductive layer through the first masking layer and on the second conductive layer through the second masking layer, respectively.

18. The packaging process of claim 17, wherein the step of forming the first plurality of solder bumps and the second plurality of solder bumps further includes the step of electroplating a solder on the first conductive layer through the first masking layer and on the second conductive layer through the second masking layer.

19. The packaging process of claim 17, further comprising the steps of:
   lifting off the first masking layer and the second masking layer from the first conductive layer and the second conductive layer, respectively; and
   lifting off portions of the first conductive layer unprotected by the first plurality of solder bumps and portions of the second conductive layer unprotected by the second plurality of solder bumps from the first major surface and the second major surface, respectively, of the semiconductor wafer.

20. The packaging process of claim 16, wherein the step of heating the glass sleeve further includes partially melting the glass sleeve to hermetically seal the die comprised of the at least one semiconductor device.

* * * * *